(12) United States Patent
Mori et al.

(10) Patent No.: US 8,592,874 B2
(45) Date of Patent: *Nov. 26, 2013

(54) SOLID STATE IMAGING DEVICE

(75) Inventors: Mitsuyoshi Mori, Kyoto (JP); Kazuo Fujiwara, Toyama (JP); Hitomi Fujiwara, legal representative, Toyama (JP); Toru Okino, Osaka (JP); Yusuke Otake, Toyama (JP)

(73) Assignee: Panasonic Corporation, Osaka (JP)

( * ) Notice: Subject to any disclaimer, the term of this patent is extended or adjusted under 35 U.S.C. 154(b) by 97 days.

This patent is subject to a terminal disclaimer.

(21) Appl. No.: 13/198,240

(22) Filed: Aug. 4, 2011

(65) Prior Publication Data

US 2011/0284929 A1    Nov. 24, 2011

Related U.S. Application Data

(63) Continuation of application No. PCT/JP2009/006750, filed on Dec. 10, 2009.

(30) Foreign Application Priority Data

Apr. 22, 2009    (JP) ................................. 2009-104320

(51) Int. Cl.
   *H01L 27/148*    (2006.01)
   *H01L 29/768*    (2006.01)
(52) U.S. Cl.
   USPC ........... 257/231; 257/291; 257/292; 257/293; 438/48; 438/65
(58) Field of Classification Search
   USPC ......... 257/231, 291–293, E27.15; 438/48, 65
   See application file for complete search history.

(56) References Cited

U.S. PATENT DOCUMENTS

| 5,739,857 | A  | * | 4/1998 | Kaneda .................... 348/349 |
| 5,859,462 | A  |   | 1/1999 | Tredwell et al. |
| 6,211,509 | B1 | * | 4/2001 | Inoue et al. ................ 250/208.1 |

(Continued)

FOREIGN PATENT DOCUMENTS

| JP | 11-284168    | 10/1999 |
| JP | 2004-165462  | 6/2004  |
| JP | 2006-294871  | 10/2006 |
| JP | 2009-043791  | 2/2009  |

OTHER PUBLICATIONS

United States Office Action issued in U.S. Appl. No. 13/198,451 mailed on Jan. 23, 2013.

*Primary Examiner* — Theresa T Doan
(74) *Attorney, Agent, or Firm* — McDermott Will & Emery LLP

(57) ABSTRACT

In each of pixels 10 arranged in an array pattern, an insulating isolation part 22 electrically isolates adjacent photoelectric conversion elements 11, and the photoelectric conversion element 11 and an amplifier transistor 14. The insulating isolation part 22 constitutes a first region A between the photoelectric conversion elements 11 where the amplifier transistor 14 is not arranged, and a second region B between the photoelectric conversion elements 11 where the amplifier transistor 14 is arranged. A low concentration first isolation diffusion layer 23 is formed below the insulating isolation part 22 constituting the first region A, and a high concentration second isolation diffusion layer 24 and a low concentration first isolation diffusion layer 23 are formed below the insulating isolation part 22 constituting the second region B. A source/drain region of the amplifier transistor 14 in the second region B is formed in a well region 25 formed simultaneously with the second isolation diffusion layer 24.

31 Claims, 10 Drawing Sheets

(56) References Cited

U.S. PATENT DOCUMENTS

| | | |
|---|---|---|
| 7,560,754 B2 * | 7/2009 | Abe et al. .................. 257/222 |
| 2005/0035375 A1 | 2/2005 | Hirata |
| 2006/0226438 A1 | 10/2006 | Katsuno et al. |
| 2007/0262240 A1 | 11/2007 | Inoue et al. |
| 2009/0242741 A1 | 10/2009 | Konishi |
| 2011/0291162 A1 * | 12/2011 | Mori et al. .................. 257/231 |

* cited by examiner

FIG.2
(a) 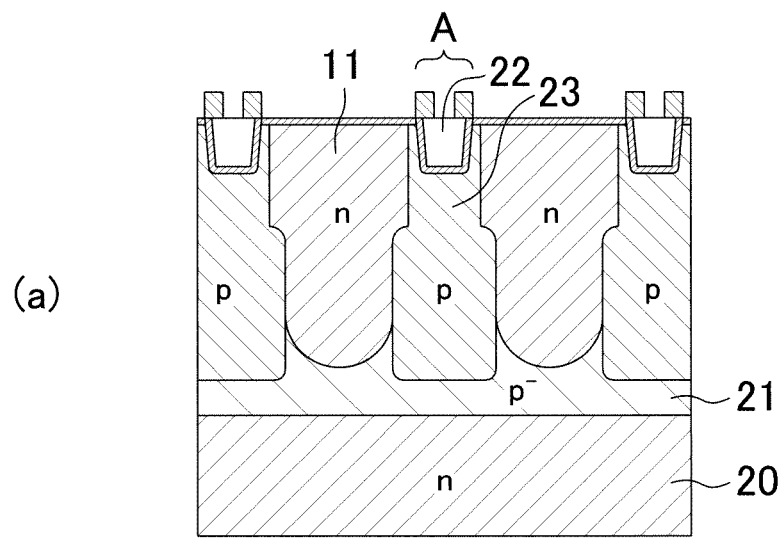
(b) 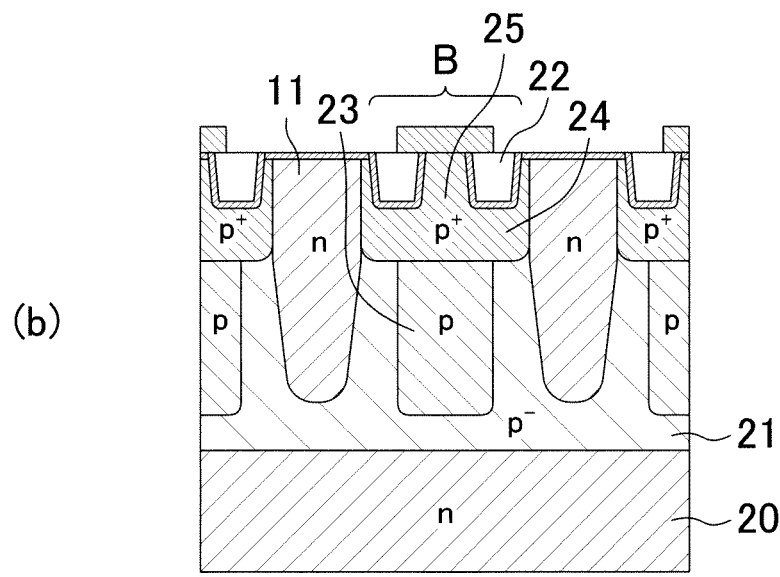

FIG.3
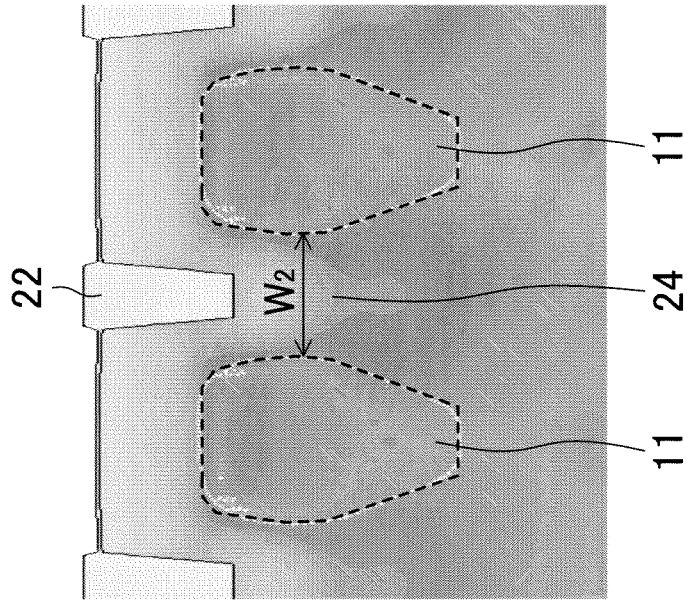
(a) $1E17/cm^3$
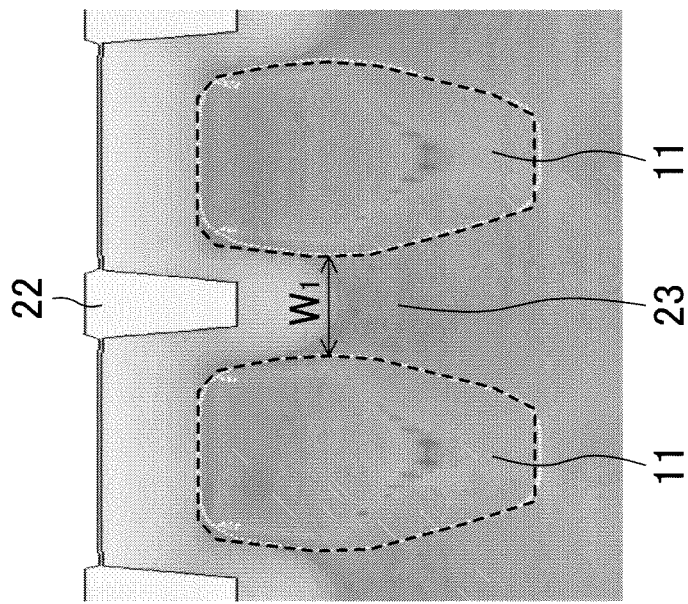
(b) $1E18/cm^3$

FIG.4
(a) 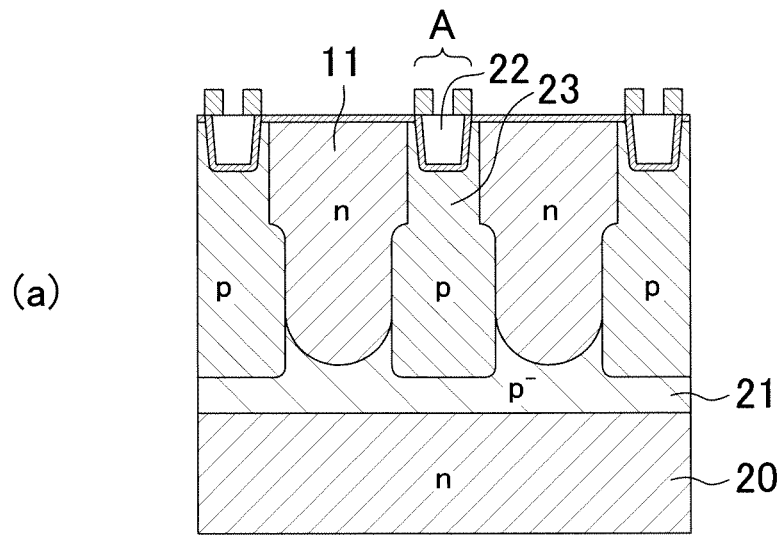
(b) 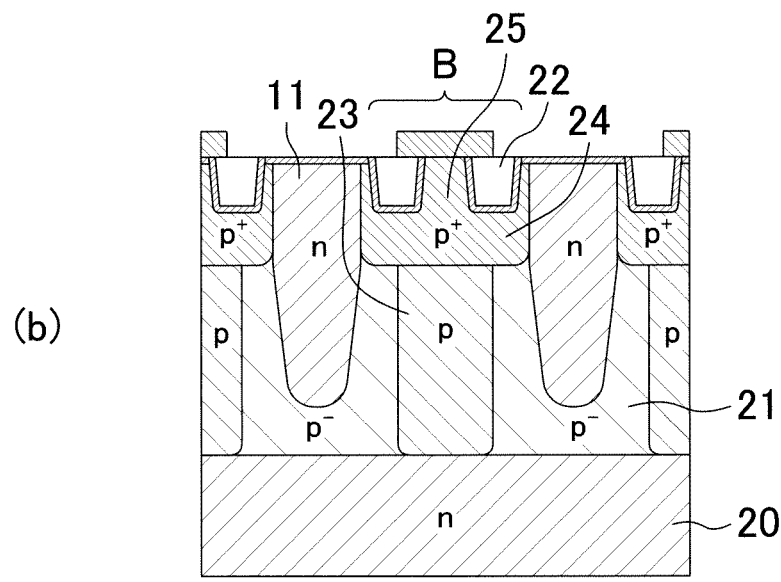

FIG.5
(a)
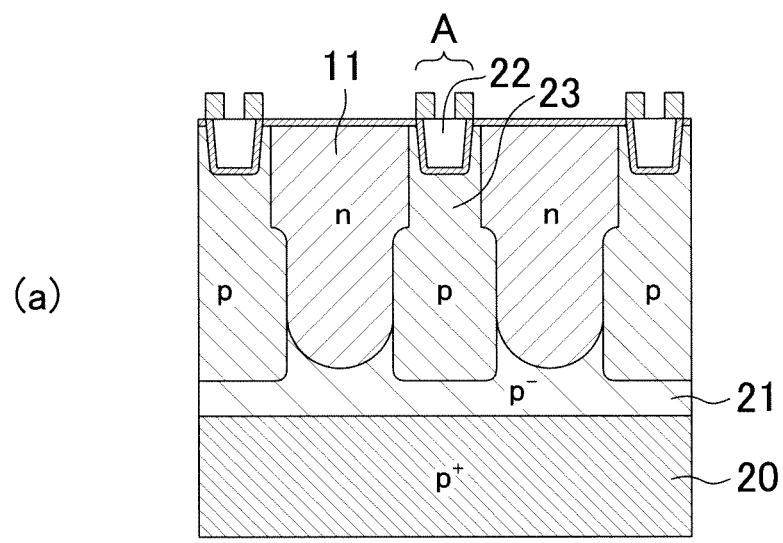
(b)
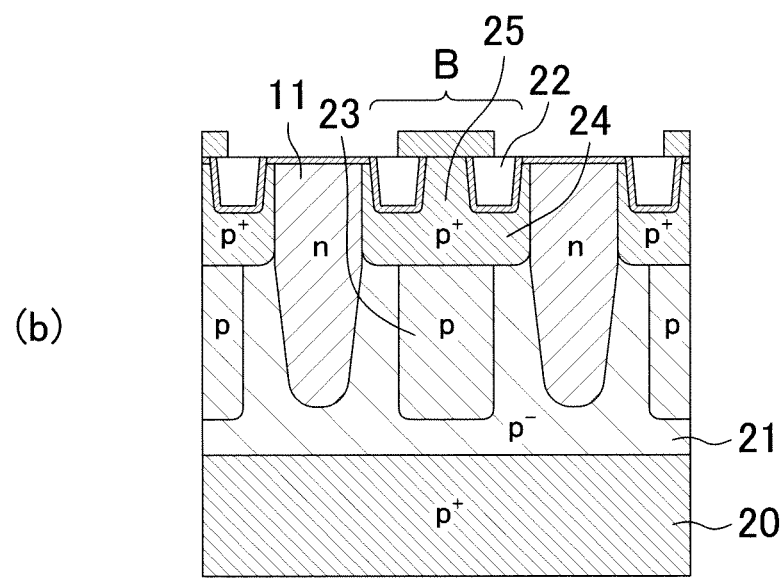

FIG.6
(a)
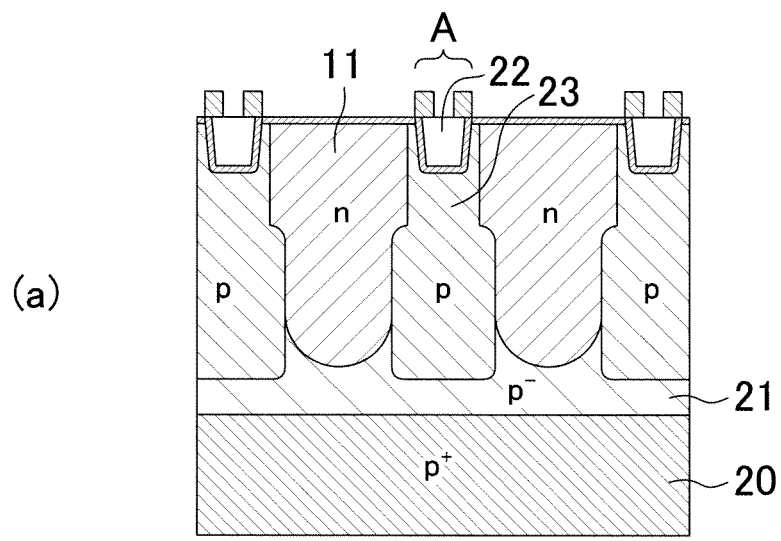
(b)
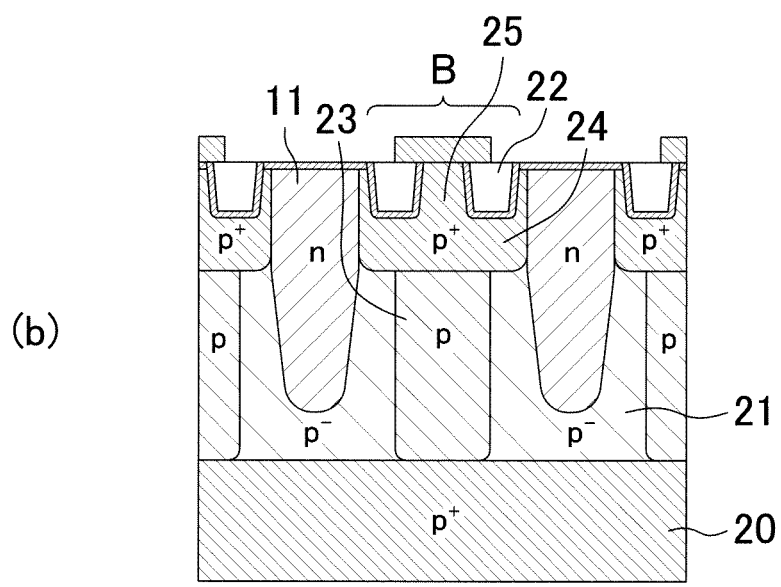

US 8,592,874 B2

SOLID STATE IMAGING DEVICE

CROSS-REFERENCE TO RELATED APPLICATION

This is a continuation of PCT International Application PCT/JP2009/006750 filed on Dec. 10, 2009 which claims priority to Japanese Patent Application No. 2009-104320 filed on Apr. 22, 2009. The disclosures of these applications including the specifications, the drawings, and the claims are hereby incorporated by reference in their entirety.

BACKGROUND

The present disclosure relates to solid state imaging devices in which pixels including photoelectric conversion elements are arranged in an array pattern.

Much attention has been paid to MOS-type solid state imaging devices due to their low power consumption, and high-speed imaging. The MOS-type solid state imaging devices have been and are being employed in various fields, such as cameras of mobile devices, on-board cameras, monitoring cameras, etc.

FIG. 7 shows a circuit diagram illustrating a structure of a conventional MOS-type solid state imaging device. As shown in FIG. 7, pixels 100 including photoelectric conversion elements (photodiodes) 101, respectively, are arranged in an array pattern to constitute an imaging region 200. Charges produced by photoelectric conversion of the photoelectric conversion element 101 are transferred to a floating diffusion layer 102 by a transfer transistor 103. The charges transferred to the floating diffusion layer 102 are amplified by an amplifier transistor 104, and are transferred to an output signal line 110 through a selection transistor 106 which is selected by a vertical shift register 108, and are output from an output end 111 through a horizontal shift register 109. A surplus of the charges accumulated in the floating diffusion layer 102 is discharged by a reset transistor 105 having a drain region connected to a power supply line 107.

FIG. 8 is a cross-sectional view illustrating a general structure of the pixels 100. As shown in FIG. 8, the photoelectric conversion elements 101, the floating diffusion layers 102, and source/drain regions of the amplifier transistors 104 are formed in a substrate 201. The pixels 100 adjacent to each other are electrically isolated from each other by an insulating isolation part 202.

Long wavelength light incident on the substrate 201, such as red light, travels to a deeper region in the substrate 201. Thus, when some of the charges produced by photoelectric conversion leak to the adjacent pixel 100, mixing of colors, or blooming may occur. To prevent the mixing of colors etc. due to the leakage of the charges, Japanese Patent Publication No. H11-284168, U.S. Pat. No. 5,859,462, etc. describe a method for forming a narrow and deep isolation diffusion layer 204 below a shallow isolation diffusion layer 203 formed below the insulating isolation part 202 as shown in FIG. 8.

When operating speed of the solid state imaging device is increased, and a potential of the substrate 210 in which the amplifier transistors 104 are formed varies during high-speed operation of the amplifier transistors, operation of the amplifier transistors becomes unstable. Thus, as shown in FIG. 8, high concentration well regions 205 are formed in the substrate 201 to form the amplifier transistors 104 in the high concentration well regions 205. This can reduce change in potential of the well regions 205 even when the amplifier transistors 104 are operated at high speed. Thus, the amplifier transistors 104 can stably be operated.

SUMMARY

When the insulating isolation parts 202 for isolating the adjacent photoelectric conversion elements 101 are narrowed according to miniaturization of the pixels 100, the following problem may arise.

FIG. 9 is a plan view illustrating a general layout of the pixels 100 arranged in an array pattern (2×2). As shown in FIG. 9, the amplifier transistor 104 and the selection transistor 106 are arranged between the photoelectric conversion elements 101 adjacent to each other in the horizontal direction, and are electrically isolated from the photoelectric conversion elements 101. The floating diffusion layer 102 and the reset transistor 105 are arranged between the photoelectric conversion elements 101 adjacent to each other in the vertical direction, and are electrically isolated from the photoelectric conversion elements 101.

When the amplifier transistors 104, the reset transistors 105, and the selection transistors 106 (hereinafter referred to as "detection transistors") are reduced in gate width, and the insulating isolation parts 202 between the detection transistor 104-106 and the photoelectric conversion elements 101 are reduced in width, the deep isolation diffusion layers 203, 204 formed below the insulating isolation parts 202, and the well regions 205 for forming the source/drain regions of the detection transistors 104-106 cannot easily be formed separately as shown in FIG. 8 by ion implantation.

For example, when the floating diffusion layer 102 and the amplifier transistor 104 are shared between the adjacent pixels 100 for further miniaturization of the solid state imaging device as shown in FIG. 10, the deep isolation diffusion layers 203, 204 formed below the insulating isolation parts 202, and the well regions 205 for forming the source/drain regions of the amplifier transistors 104 cannot easily be formed separately by ion implantation.

Accordingly, the isolation diffusion layers 203, 204 and the well regions 205 have to be simultaneously formed by ion implantation at the same impurity concentration. When the ion implantation is performed at an impurity concentration for forming the isolation diffusion layers 203, 204, an impurity concentration of the simultaneously formed well regions 205 is reduced, and the detection transistors 104-106 cannot be operated stably. When the ion implantation is performed at an impurity concentration for forming the well regions 205, the simultaneously formed isolation diffusion layers 203, 204 are widened, and the photoelectric conversion elements 101 are narrowed. As a result, the amount of charges accumulated in the photoelectric conversion elements 101 is reduced, thereby reducing sensitivity of the solid state imaging device.

In view of the foregoing, the present disclosure is intended to provide a solid state imaging device which can stably be operated with high sensitivity even when the solid state imaging device is miniaturized, and operating speed thereof is increased.

To achieve the object of the present disclosure, a low concentration isolation diffusion layer is formed below the insulating isolation part which is formed in a region between the adjacent photoelectric conversion elements where the detection transistors are arranged, and a high concentration isolation diffusion layer is formed below the insulating isolation part which is formed in a region between the adjacent photoelectric conversion elements where the detection transistors are formed. Further, source/drain regions of the detection transistors between the insulating isolation parts are formed in the well regions which are formed simultaneously with the high concentration isolation diffusion layer.

With this configuration, the detection transistors are formed in the high concentration well regions. Even when the detection transistors are operated at high speed, change in potential of the well regions can be reduced, thereby allowing stable operation of the detection transistors. Further, since the low concentration isolation diffusion layer is formed below the insulating isolation part which is formed in the region where the detection transistors are not arranged, the width of photoelectric conversion elements can be ensured, thereby preventing reduction in sensitivity of the solid state imaging device. Thus, even when the solid state imaging device is miniaturized, and its operating speed is increased, the solid state imaging device can be operated stably with high sensitivity.

A solid state imaging device according to an aspect of the present disclosure is a solid state imaging device including: a plurality of pixels arranged in an array pattern, wherein each of the pixels includes a photoelectric conversion element which is formed with a first conductivity type diffusion region formed in a substrate, a transfer transistor for transferring charges accumulated in the photoelectric conversion element to a floating diffusion layer, and an amplifier transistor for outputting the charges transferred to the floating diffusion layer to an output line. An insulating isolation part electrically isolates the photoelectric conversion elements adjacent to each other, electrically isolates the photoelectric conversion element and the floating diffusion layer, and electrically isolates the photoelectric conversion element and a source/drain region constituting the amplifier transistor, the insulating isolation part constitutes at least a first region between the photoelectric conversion elements where the amplifier transistor is not arranged, and a second region between the photoelectric conversion elements where the amplifier transistor is arranged. A second conductivity type isolation diffusion layer is formed below the insulating isolation part, the isolation diffusion layer formed below the insulating isolation part constituting the first region is formed with a first isolation diffusion layer having a first impurity concentration, the isolation diffusion layer formed below the insulating isolation part constituting the second region is formed with a second isolation diffusion layer having a second impurity concentration, and the first isolation diffusion layer formed below the second isolation diffusion layer, the second impurity concentration being higher than the first impurity concentration. The source/drain region of the amplifier transistor between the insulating isolation parts constituting the second regions is formed in a well region which is formed simultaneously with the second isolation diffusion layer.

In a preferred embodiment, the amplifier transistor of one of the pixels is shared by at least one pixel adjacent to the one of the pixels.

In a preferred embodiment, the first isolation diffusion layer and the second isolation diffusion layer are formed by performing multiple ion implantations at different energy levels.

In a preferred embodiment, the first impurity concentration is in a range of $1E14$-$1E19/cm^3$, and the second impurity concentration is in a range of $1E15$-$1E20/cm^3$. A difference between the first impurity concentration and the second impurity concentration is preferably $1E1/cm^3$ or higher.

In a preferred embodiment, the first isolation diffusion layer formed below the insulating isolation part constituting the second region extends to a depth greater than a depth of the first isolation diffusion layer formed below the insulating isolation part constituting the first region.

In a preferred embodiment, the substrate is formed with a semiconductor substrate and a semiconductor layer formed on the semiconductor substrate, and the photoelectric conversion elements are formed in the semiconductor layer. The semiconductor substrate has the first conductivity type, and the semiconductor layer has the second conductivity type. Alternatively, the semiconductor substrate and the semiconductor layer have the second conductivity type. In this case, an impurity concentration of the semiconductor substrate is preferably higher than an impurity concentration of the semiconductor layer. The first isolation diffusion layer formed below the insulating isolation part constituting the second region is preferably in contact with a surface of the semiconductor substrate.

In a preferred embodiment, an impurity concentration of the photoelectric conversion elements is lower than the first impurity concentration of the first isolation diffusion layer. The photoelectric conversion element extends to a depth less than a depth of the first isolation diffusion layer.

In a preferred embodiment, each of the pixels further includes a reset transistor for discharging a surplus of the charges accumulated in the floating diffusion layer, wherein the insulating isolation part further constitutes a third region between the photoelectric conversion elements where the reset transistor is arranged, the isolation diffusion layer formed below the insulating isolation part constituting the third region is formed with the second isolation diffusion layer, and the first isolation diffusion layer formed below the second isolation diffusion layer, and a source/drain region of the reset transistor between the insulating isolation parts constituting the third regions is formed in a well region which is formed simultaneously with the second isolation diffusion layer.

According to the present disclosure, the solid state imaging device can stably be operated with high sensitivity even when the solid state imaging device is miniaturized, and its operation speed is increased.

BRIEF DESCRIPTION OF THE DRAWINGS

FIG. 2A is a cross-sectional view taken along the line IIa-IIa indicated in FIG. 1, and FIG. 2B is a cross-sectional view taken along the line IIb-IIb indicated in FIG. 1.

FIGS. 3A and 3B show the results of simulation of forming isolation diffusion layers having different impurity concentrations.

FIG. 4A and FIG. 4B show an alternative of the first embodiment, i.e., FIG. 4A is a cross-sectional view taken along the line IIa-IIa indicated in FIG. 1, and FIG. 4B is a cross-sectional view taken along the line IIb-IIb indicated in FIG. 1.

FIGS. 5A and 5B show another alternative of the first embodiment, i.e., FIG. 5A is a cross-sectional view taken along the line IIa-IIa indicated in FIG. 1, and FIG. 5B is a cross-sectional view taken along the line IIb-IIb indicated in FIG. 1.

FIGS. 6A and 6B show still another alternative of the first embodiment, i.e., FIG. 6A is a cross-sectional view taken along the line IIa-IIa indicated in FIG. 1, and FIG. 6B is a cross-sectional view taken along the line IIb-IIb indicated in FIG. 1.

DETAILED DESCRIPTION

An embodiment of the present disclosure will be described in detail with reference to the drawings. The present disclosure is not limited to the following embodiment. The embodiment may be modified within the scope of the present disclosure. The embodiment may be combined with other embodiments.

First Embodiment

A solid state imaging device of the present disclosure is a MOS-type solid state imaging device including a plurality of pixels arranged in an array pattern. A circuit structure thereof is basically the same as that shown in FIG. 7.

Figure 1:
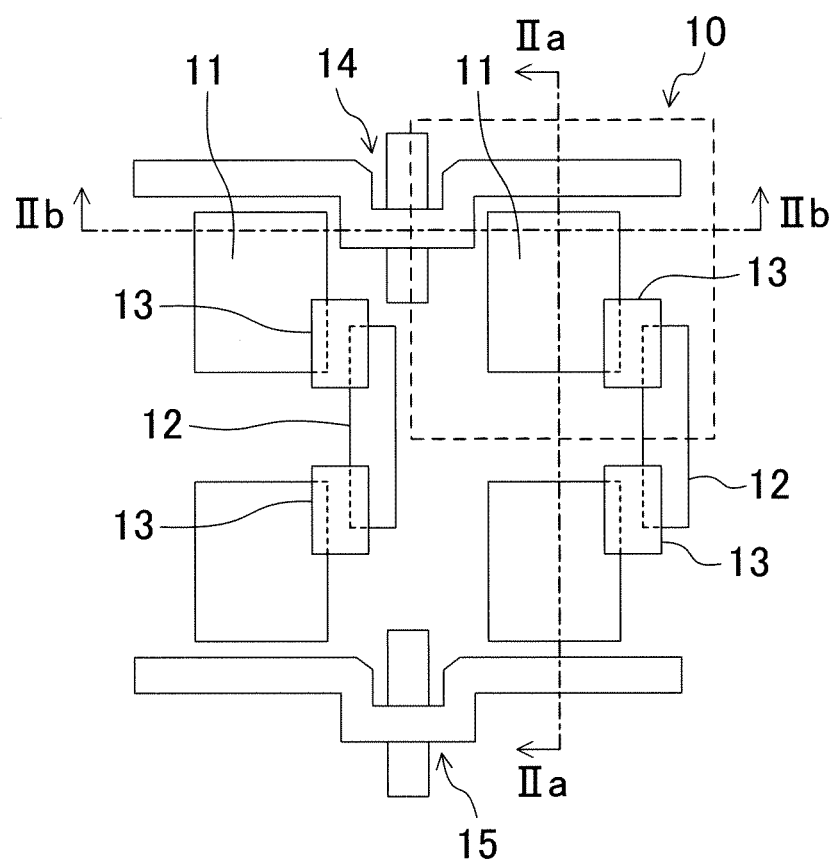
FIG. 1 is a plan view illustrating a layout of pixels arranged in an array pattern according to a first embodiment of the present disclosure.

FIG. 1 is a plan view illustrating a layout of pixels 10 arranged in an array pattern (2×2) according to a first embodiment of the present disclosure. FIG. 2A is a cross-sectional view taken along the line IIa-IIa indicated in FIG. 1, and FIG. 2B is a cross-sectional view taken along the line IIb-IIb indicated in FIG. 1.

As shown in FIGS. 1, 2A, and 2B, each of the pixels 10 includes a photoelectric conversion element (a photodiode) 11 formed with an n-type (first conductivity type) diffusion region formed in a substrate (an n-type semiconductor substrate 20 on which a p$^-$ semiconductor layer 21 is formed), a transfer transistor 13 for transferring charges accumulated in the photoelectric conversion element 11 to a floating diffusion layer 12, an amplifier transistor 14 for outputting the charges transferred to the floating diffusion layer 12 to an output line (not shown), and a reset transistor 15 for discharging a surplus of the charges accumulated in the floating diffusion layer 12.

As shown in FIG. 1, the floating diffusion layer 12 and the amplifier transistor 14 are arranged to be shared by adjacent pixels 10 (pixels adjacent to each other in the vertical direction in FIG. 1). Specifically, the floating diffusion layer 12 and the amplifier transistor 14 are not arranged between the vertically adjacent pixels. Thus, the photoelectric conversion elements 11 can be elongated in the vertical direction to increase a region of the photoelectric conversion elements 11. The charges accumulated in the vertically adjacent photoelectric conversion elements 11 are separately transferred to the floating diffusion layer 12 through the transfer transistors 13 of the corresponding pixels 10. Thus, the charges from the different pixels are not mixed.

An insulating isolation part 22 electrically isolates the photoelectric conversion elements 11 adjacent to each other, electrically isolates the photoelectric conversion element 11 and the floating diffusion layer 12, and electrically isolates the photoelectric conversion element 11 and a source/drain region constituting the amplifier transistor 14. The insulating isolation part 22 constitutes a first region A between the photoelectric conversion elements 11 where the amplifier transistor 14 is not arranged as shown in FIG. 2A, and a second region B between the photoelectric conversion elements 11 where the amplifier transistor 14 is arranged as shown in FIG. 2B.

A p-type (second conductivity type) isolation diffusion layer is formed below the insulating isolation part 22. As shown in FIG. 2A, the isolation diffusion layer formed below the insulating isolation part 22 constituting the first region A is formed with a low concentration first isolation diffusion layer 23. As shown in FIG. 2B, the isolation diffusion layer formed below the insulating isolation part 22 constituting the second region B is formed with a high concentration second isolation diffusion layer 24, and a low concentration first isolation diffusion layer 23 formed below the second isolation diffusion layer 24.

As shown in FIG. 2B, a source/drain region (not shown) of the amplifier transistor 14 between the insulating isolation parts 22 in the second region B is formed in a well region 25 which is formed simultaneously with the second isolation diffusion layer 24.

With this configuration, the amplifier transistor 14 is formed in the high concentration well region 25. Thus, even when the amplifier transistor 14 is operated at high speed, change in potential of the well region 25 can be reduced, and the amplifier transistor 14 can stably be operated. Since the low concentration isolation diffusion layer 23 is formed below the insulating isolation part 22 on which the amplifier transistor 14 is not arranged, a width of the photoelectric conversion element 11 can be ensured, thereby preventing reduction in sensitivity of the solid state imaging device. Thus, the solid state imaging device can stably be operated with high sensitivity even when the solid state imaging device is miniaturized, and its operating speed is increased.

In the present embodiment, the high concentration second isolation diffusion layer 24 is selectively formed in the second region B where the amplifier transistor 14 is arranged between the photoelectric conversion elements 11. However, when the high concentration second isolation diffusion layer 24 is selectively formed below the insulating isolation part 22 arranged for isolating the other detection transistors (reset transistors and selection transistors), the same advantage as that described above can be obtained.

For example, as shown in FIG. 1, when the insulating isolation part 22 constitutes a third region between the photoelectric conversion elements 11 where the reset transistor 15 is arranged, the isolation diffusion layer formed below the insulating isolation part 22 constituting the third region may be formed with the high concentration second isolation diffusion layer 24, and the low concentration first isolation diffusion layer 23 formed below the second isolation diffusion layer 24. In this case, the source/drain region of the reset transistor 15 between the insulating isolation parts 22 constituting the third region is formed in the well region formed simultaneously with the second isolation diffusion layer 24.

In the present disclosure, impurity concentrations of the first isolation diffusion layer 23 and the first isolation diffusion layer 24 may not necessarily be uniform. The first isolation diffusion layer 23 and the second isolation diffusion layer 24 can be formed by performing multiple ion implantations at different energy levels. For example, when the photoelectric conversion element 11 extends to a depth of about 1 μm, the isolation diffusion layer 23 can be formed to extend to a depth greater than that of the photoelectric conversion element 11 by performing ion implantation three or more times at different energy levels in the range of 50 keV-3000 keV. The first isolation diffusion layer 23 formed below the insulating isolation part 22 constituting the first region A, and the first isolation diffusion layer 23 formed below the insulating isolation part 22 constituting the second region B can be formed at the same time. The second isolation diffusion layer 24 can easily be formed selectively in the second region B as shown in FIG. 2B by ion implantation using a mask covering the other regions than the second region B.

The first isolation diffusion layer 23 typically has an impurity concentration (a first impurity concentration) in the range of $1E14$-$1E19/cm^3$. The second isolation diffusion layer 24 typically has an impurity concentration (a second impurity concentration) in the range of $1E15$-$1E20/cm^3$. A difference between the first impurity concentration and the second impurity concentration is preferably $1E1/cm^3$ or higher.

FIGS. 3A and 3B show the results of simulation of forming the isolation diffusion layers of different impurity concentrations below the insulating isolation parts 22 constituting the first regions A shown in FIG. 2A. Each of the photoelectric conversion elements 11 had a width of 1.0 μm, and an impurity concentration of $1E17/cm^3$. A width of the isolation diffusion layer 23 was 0.2 μm, and an impurity concentration of the isolation diffusion layer 23 was $1E17/cm^3$ in FIG. 3A, and was $1E18/cm^3$ in FIG. 3B. As a result, width W1 of the low concentration isolation diffusion layer 23 was smaller than width W2 of the high concentration isolation diffusion layer 24 by about 0.2 μm. Specifically, the width of the photoelectric conversion elements 11 isolated by the low concentration isolation diffusion layer 23 can be larger than the width of the photoelectric conversion elements 11 isolated by the high concentration isolation diffusion layer 24 by about 0.2 μm. Since the impurity concentration of the isolation diffusion layer 23 in FIG. 3B is higher than that of the isolation diffusion layer 23 in FIG. 3A, the impurity region in FIG. 3B is increased in width, and the photoelectric conversion element 11 is reduced in depth as compared with the impurity region in FIG. 3A.

In the present disclosure, the "substrate" designates a base material in which the photoelectric conversion elements 11 are formed. Thus, the "substrate" of the present disclosure is not limited to the structure shown in FIGS. 2A and 2B including the n-type semiconductor substrate 20 and the p⁻ semiconductor layer 21 formed thereon, and can be modified in various ways. For example, an n-type epitaxial layer may be formed on the n-type semiconductor substrate 20, and the p⁻ semiconductor layer 21 may be formed on the n-type epitaxial layer. A p-type substrate may be used alone. When the n-type semiconductor substrate 20 is used, leakage of the charges generated below the insulating isolation part 22 by photoelectric conversion to the photoelectric conversion element 11 can be prevented by applying a power supply voltage to the n-type semiconductor substrate 20. This can reduce mixing of colors, and blooming.

For example, the photoelectric conversion element 11 is formed to have an impurity concentration in the range of $1E14$-$1E17/cm^3$. In this case, the impurity concentration of the isolation diffusion layer 23 below the insulating isolation part 22 is preferably higher than the impurity concentration of the photoelectric conversion element 11. This can increase a potential barrier between the photoelectric conversion elements 11, thereby preventing the charges accumulated in the photoelectric conversion element 11 from flowing to the adjacent photoelectric conversion element 11. This can reduce the mixing of colors, and blooming.

The pixels 10 configured as shown in FIGS. 2A and 2B can easily be formed by a conventional semiconductor process. For example, the insulating isolation part 22 is preferably formed by shallow trench isolation (STI) to ensure an opening area of the photoelectric conversion element 11, but may be formed by local oxidation of silicon (LOCOS). When the insulating isolation part 22 is formed by the STI, a p-type layer is preferably formed to surround the insulating isolation part 22 to prevent the charges generated in a dark state due to a lattice defect of an interface of the STI from entering the photoelectric conversion element 11.

Figure 7:
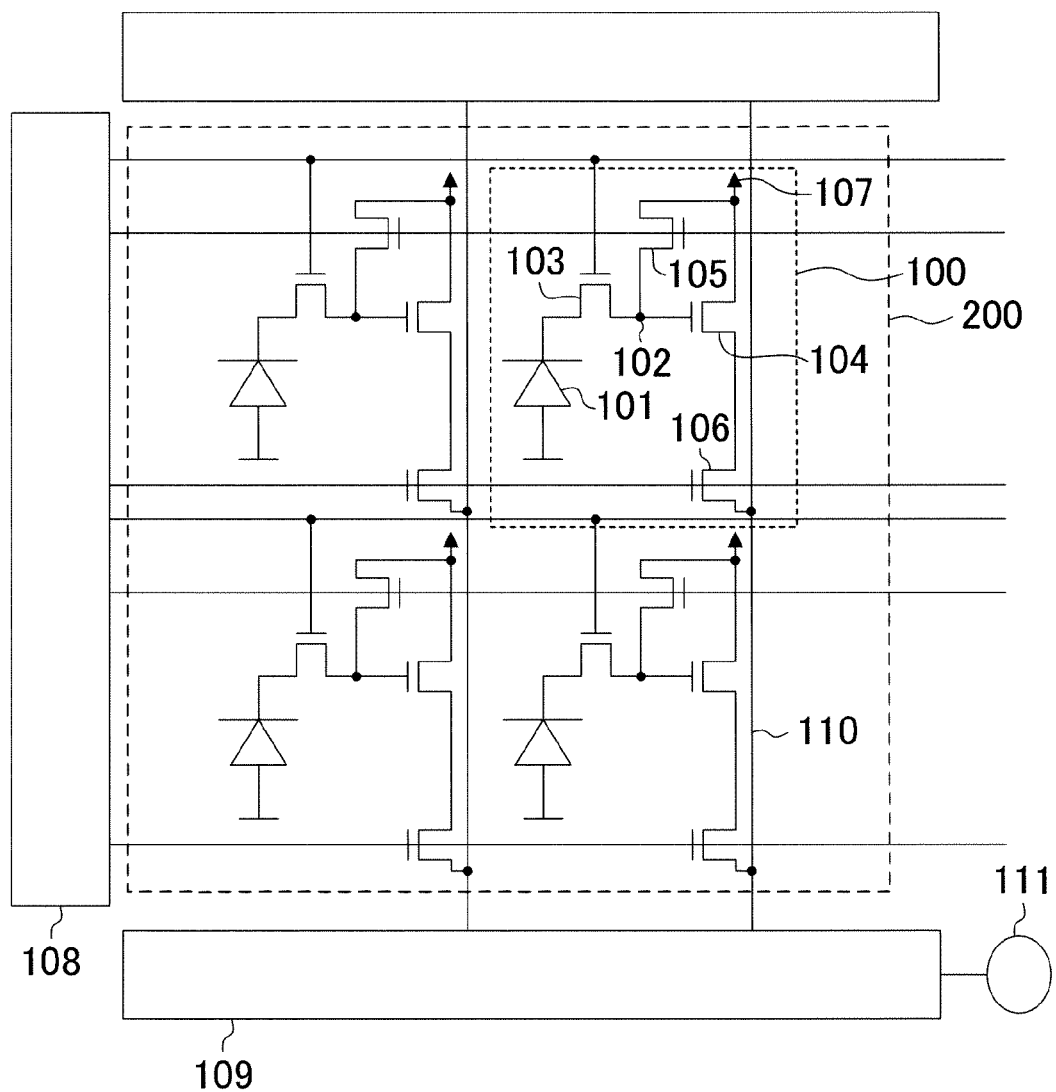
FIG. 7 is a circuit diagram illustrating a structure of a conventional MOS-type solid state imaging device.
Figure 8:
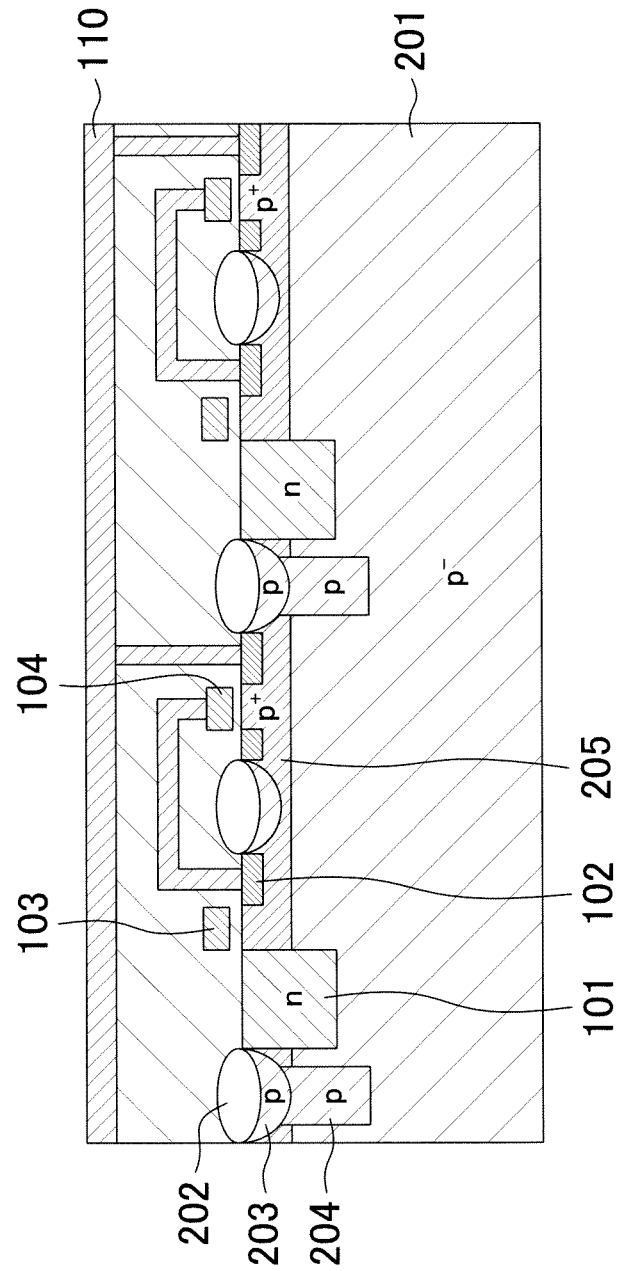
FIG. 8 is a cross-sectional view illustrating a structure of conventional pixels.

The solid state imaging device of the present disclosure includes peripheral circuits, such as a vertical shift transistor and a horizontal shift transistor shown in FIG. 7. The peripheral circuits are also formed with the same MOS transistors as the detection transistors of the pixels 10, such as the amplifier transistors. Thus, source/drain regions of the MOS transistors constituting the peripheral circuits can be formed in the well regions which are formed simultaneously with the second isolation diffusion layers 24 of the present disclosure. This can reduce the number of manufacturing processes, and can reduce manufacturing cost of the solid state imaging device. In this case, the isolation diffusion layer formed below the insulating isolation part of the peripheral circuit may be formed to extend shallower than the first isolation diffusion layer 23 of the present disclosure. When this isolation diffusion layer is formed by ion implantation, a thick resist is no longer necessary. Thus, when the peripheral circuits are formed with CMOS transistors, a distance between a p-type well and an n-type well can be shortened. For example, when a 0.25 μm CMOS rule is applied, the distance between the n-type well and the p-type well can be as small as about 1 μm, thereby reducing an area of the peripheral circuits.

A well region is preferably formed below the floating diffusion layer 12 simultaneously with the second isolation diffusion layer 24. In this case, the impurity concentration of the well region is preferably lower than the impurity concentration of the second isolation diffusion layer 24. This can reduce capacity of a depletion layer between the floating diffusion layer 12 and the well region, thereby increasing output voltage per charge. For example, when the impurity concentration of the well region is the same as the impurity concentration of the first isolation diffusion layer 23 of the present disclosure, a width of the depletion layer increases by about three times, i.e., the capacity of the depletion layer is reduced to about ⅓. Accordingly, output voltage of the floating diffusion layer 12 increases by about three times, thereby achieving high gain.

Alternative of First Embodiment

FIGS. 4A and 4B show a structure of pixels 10 of an alternative of the first embodiment. FIG. 4A is a cross-sectional view taken along the line IIa-IIa indicated in FIG. 1, and FIG. 4B is a cross-sectional view taken along the line IIb-IIb indicated in FIG. 1.

A feature of this alternative is that the first isolation diffusion layer 23 formed below the insulating isolation part 22 constituting the second region B is formed to extend to a depth greater than the first isolation diffusion layer 23 formed below the insulating isolation part 22 constituting the first region A as shown in FIGS. 4A and 4B.

With this configuration, sheet resistances of the isolation diffusion layers 23, 24 formed below the insulating isolation part 22 constituting the second region B can be reduced. Thus, even when the amplifier transistor 14 is operated at high speed, potential of the isolation diffusion layers 23, 24 can be stabilized.

In FIG. 4B, the isolation diffusion layer 23 formed below the insulating isolation part 22 constituting the second region B is in contact with the substrate 20. However, the isolation diffusion layer 23 is not necessarily in contact with the substrate. The first isolation diffusion layer 23 in the second region B is preferably formed to extend to a depth 1.5 times or more greater than the first isolation diffusion layer 23 in the first region A. In this case, the sheet resistance of the first isolation diffusion layer 23 in the second region B is lower than ⅓ of that of the first isolation diffusion layer 23 in the first region A. This offers the above-described advantages more significantly.

FIGS. 5A and 5B show another alternative of the first embodiment. FIG. 5A is a cross-sectional view taken along the line IIa-IIa indicated in FIG. 1, and FIG. 5B is a cross-sectional view taken along the line IIb-IIb indicated in FIG. 1.

A feature of this alternative is that the "substrate" for forming the photoelectric conversion elements 11 is formed with a p-type semiconductor substrate 20 on which a p-type semiconductor layer 21 is formed as shown in FIGS. 5A and 5B. The p-type semiconductor substrate 20 has an impurity concentration of about $1E19/cm^3$.

With this configuration, life time of minority carriers is reduced, and the charges generated below the isolation diffusion layer 23 by photoelectric conversion are prevented from leaking to the photoelectric conversion elements 11. This can reduce the mixing of colors, and blooming. In addition, the photoelectric conversion element 11 can extend to a greater depth by reducing the impurity concentration of the p-type semiconductor layer 21. This can improve sensitivity to long wavelength light. Since the p-type semiconductor substrate 20 has the same conductivity type as those of the isolation diffusion layers 23, 24, the sheet resistances of the isolation diffusion layers 23, 24 formed below the insulating isolation part 22 constituting the second region B can further be reduced. This can stabilize the potential of the isolation diffusion layers 23, 24 even when the amplifier transistor 14 is operated at high speed.

The impurity concentration of the p+ semiconductor substrate 20 is preferably in the range of, for example, $1E18$-$1E20/cm^3$. The impurity concentration of the p-type semiconductor layer 21 is preferably in the range of, for example, $1E14$-$1E16/cm^3$.

FIGS. 6A and 6B show still another alternative of the first embodiment. FIG. 6A is a cross-sectional view taken along the line IIa-IIa indicated in FIG. 1, and FIG. 6B is a cross-sectional view taken along the line IIb-IIb indicated in FIG. 1.

As features of this alternative, the "substrate" for forming the photoelectric conversion elements 11 is formed with a high concentration p+ semiconductor substrate 20 and a p⁻ semiconductor layer 21, and the first isolation diffusion layer 23 formed below the insulating isolation part 22 constituting the second region B is in contact with a surface of the p+ semiconductor substrate 20 as shown in FIGS. 6A and 6B.

With this configuration, the sheet resistances of the isolation diffusion layers 23, 24 which are in contact with the p+ semiconductor substrate 20 can further be reduced. This can stabilize the potential of the isolation diffusion layers 23, 24 even when the amplifier transistor 14 is operated at high speed.

Figure 9:
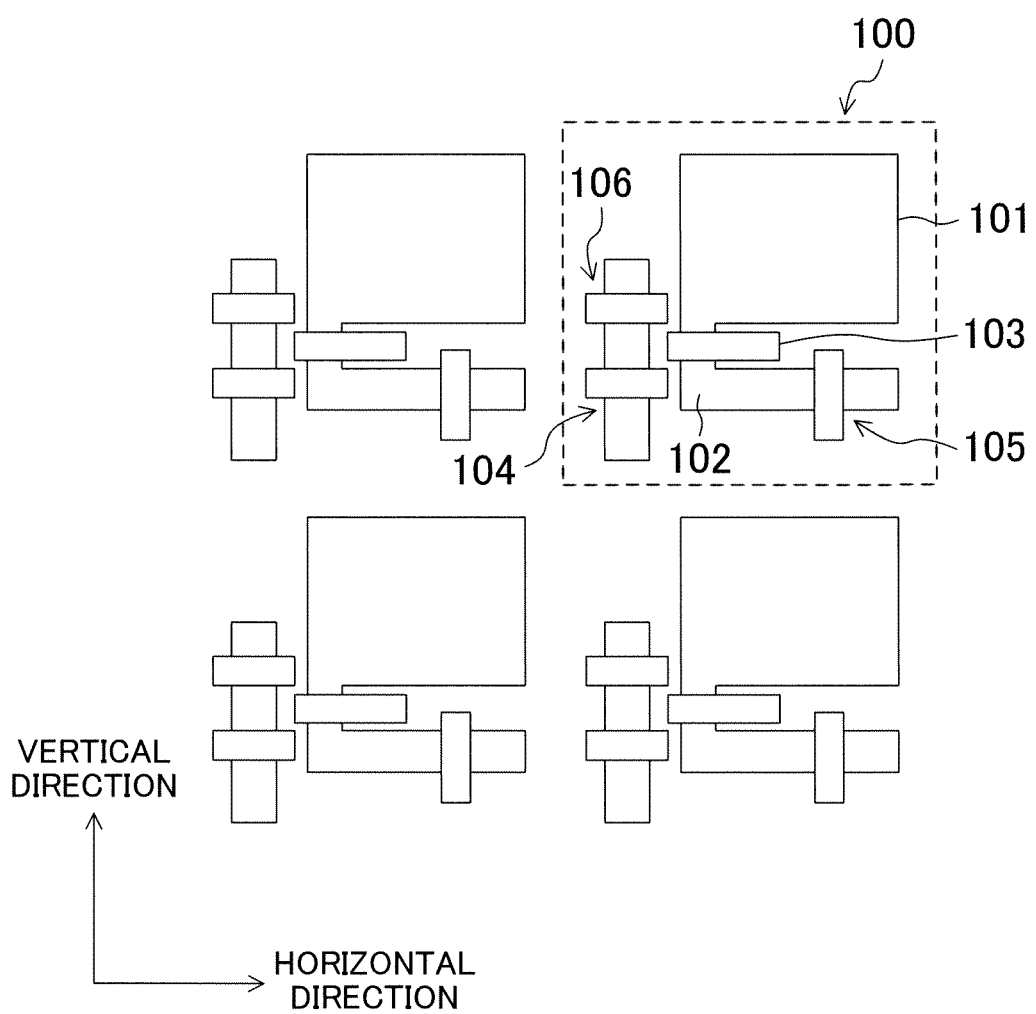
FIG. 9 is a plan view illustrating a layout of conventional pixels arranged in an array pattern.
Figure 10:
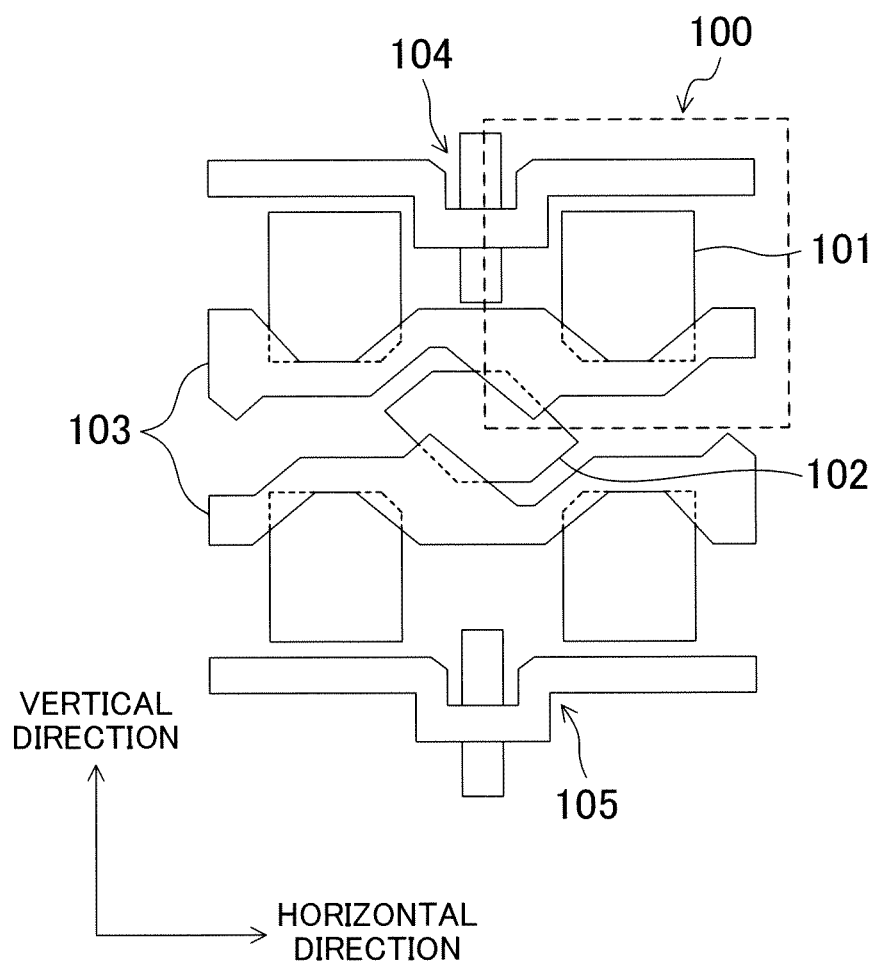
FIG. 10 is a plan view illustrating the conventional pixels arranged in an array pattern.

The present disclosure has been described by way of the above-described preferred embodiment. However, the embodiment is not intended to limit the disclosure, and can be modified in various ways. For example, the embodiment has been described based on the layout of the pixels 10 shown in FIG. 1. However, the present disclosure is not limited thereto, and can be applied to the layout shown in FIG. 9 or 10, for example.

The solid state imaging device of the present disclosure can stably be operated with high sensitivity even when the solid state imaging device is miniaturized, and its operating speed is increased. Thus, the present disclosure can suitably be used for high-sensitivity and high-speed solid state imaging devices.

What is claimed is:

1. A solid state imaging device comprising:
a plurality of pixels arranged in an array pattern, wherein each of the pixels includes:
a photoelectric conversion element which is formed with a first conductivity type diffusion region formed in a substrate, and
an amplifier transistor,
an insulating isolation part electrically isolates the photoelectric conversion elements adjacent to each other,
the insulating isolation part constitutes at least a first region between the photoelectric conversion elements where the amplifier transistor is not arranged, and a second region between the photoelectric conversion elements where the amplifier transistor is arranged,
a second conductivity type isolation diffusion layer is formed below the insulating isolation part,
the isolation diffusion layer formed below the insulating isolation part constituting the first region is formed with a first isolation diffusion layer having a first impurity concentration, the first isolation diffusion layer is formed between the photoelectric conversion elements,
the isolation diffusion layer formed below the insulating isolation part constituting the second region is formed with a second isolation diffusion layer having a second impurity concentration, the second diffusion layer is formed between the photoelectric conversion elements, and the first isolation diffusion layer formed below the second isolation diffusion layer, the second impurity concentration being higher than the first impurity concentration, and
the amplifier transistor is disposed in the second isolation diffusion layer.

2. The solid state imaging device of claim 1, wherein the amplifier transistor of one of the pixels is shared by at least one pixel adjacent to the one of the pixels.

3. The solid state imaging device of claim 1, wherein
the first impurity concentration is in a range of $1E14$-$1E19/cm^3$, and
the second impurity concentration is in a range of $1E15$-$1E20/cm^3$.

4. The solid state imaging device of claim 3, wherein a difference between the first impurity concentration and the second impurity concentration is $1E1/cm^3$ or higher.

5. The solid state imaging device of claim 1, wherein the first isolation diffusion layer formed below the insulating isolation part constituting the second region extends to a depth greater than a depth of the first isolation diffusion layer formed below the insulating isolation part constituting the first region.

6. The solid state imaging device of claim 1, wherein the substrate is formed with a semiconductor substrate and a semiconductor layer formed on the semiconductor substrate, and the photoelectric conversion elements are formed in the semiconductor layer.

7. The solid state imaging device of claim 6, wherein the semiconductor substrate has the first conductivity type, and the semiconductor layer has the second conductivity type.

8. The solid state imaging device of claim 6, wherein the semiconductor substrate and the semiconductor layer have the second conductivity type.

9. The solid state imaging device of claim 8, wherein an impurity concentration of the semiconductor substrate is higher than an impurity concentration of the semiconductor layer.

10. The solid state imaging device of claim 8, wherein the first isolation diffusion layer formed below the insulating isolation part constituting the second region is in contact with a surface of the semiconductor substrate.

11. The solid state imaging device of claim 1, wherein an impurity concentration of the photoelectric conversion elements is lower than the first impurity concentration of the first isolation diffusion layer.

12. The solid state imaging device of claim 1, wherein the photoelectric conversion element extends to a depth less than a depth of than the first isolation diffusion layer.

13. The solid state imaging device of claim 1 further comprising:
a second conductivity type semiconductor layer having a third impurity concentration formed below the photoelectric conversion element, the third impurity concentration being lower than the first impurity concentration.

14. The solid state imaging device of claim 1, wherein each of the pixels further includes a transfer transistor for transferring charges accumulated in the photoelectric conversion element to a floating diffusion layer.

15. The solid state imaging device of claim 14, wherein the amplifier transistor outputs the charges transferred to the floating diffusion layer to an output line.

16. The solid state imaging device of claim 14, wherein the insulating isolation part electrically isolates the photoelectric conversion element and the floating diffusion layer, and electrically isolates the photoelectric conversion element and a source/drain region constituting the amplifier transistor.

17. The solid state imaging device of claim 14, wherein
each of the pixels further includes a reset transistor for discharging a surplus of the charges accumulated in the floating diffusion layer, wherein
the insulating isolation part further constitutes a third region between the photoelectric conversion elements where the reset transistor is arranged,
the isolation diffusion layer formed below the insulating isolation part constituting the third region is formed with the second isolation diffusion layer, and the first isolation diffusion layer faulted below the second isolation diffusion layer, and
a source/drain region of the reset transistor between the insulating isolation parts constituting the third region is formed in the second isolation diffusion layer.

18. A solid state imaging device comprising:
a substrate;
a plurality of photoelectric conversion elements of a first conductivity type arranged in an array in the substrate;
a plurality of amplifier transistors disposed in the substrate;
an insulating isolation part disposed in the substrate, wherein the insulating isolation part includes a first insulating isolation region, a second insulating isolation region and a third insulating isolation region, wherein no insulating isolation region is disposed between the second and third insulating isolation regions, and wherein one of the plurality of amplifier transistors is disposed between the second insulating isolation region and the third insulating isolation region;
a first isolation diffusion layer of a second conductivity type disposed in the substrate, wherein the first isolation diffusion layer is disposed below the first to third insulating isolation regions; and
a second isolation diffusion layer of the second conductivity type disposed in the substrate, wherein the second insulating isolation region, the third insulating isolation region and the one of the plurality of amplifier transistors are disposed in the same second isolation diffusion layer, wherein the second isolation diffusion layer is disposed above the first isolation diffusion layer, and wherein the second isolation diffusion layer has a higher impurity concentration than the first isolation diffusion layer.

19. The solid state imaging device of claim 18, wherein one of the plurality of amplifier transistor is electrically connected with at least two of the plurality of photoelectric conversion elements adjacent to each other.

20. The solid state imaging device of claim 18, wherein
an impurity concentration of the first isolation diffusion layer is in a range of $1E14$-$1E19/cm^3$, and
an impurity concentration of the second isolation region is in a range of $1E15$-$1E20/cm^3$.

21. The solid state imaging device of claim 20, wherein a difference between the impurity concentration of the first isolation diffusion layer and the impurity concentration of the second isolation diffusion layer is $1E1/cm^3$ or higher.

22. The solid state imaging device of claim 18, wherein the first isolation diffusion layer where the second and third insulating isolation regions are disposed extends to a depth greater than a depth of the first isolation diffusion layer disposed below the first insulating isolation region.

23. The solid state imaging device of claim 18, wherein the substrate is disposed with a semiconductor substrate and a semiconductor layer disposed on the semiconductor substrate, and the plurality of photoelectric conversion elements are disposed in the semiconductor layer.

24. The solid state imaging device of claim 23, wherein the semiconductor substrate has the first conductivity type, and the semiconductor layer has the second conductivity type.

25. The solid state imaging device of claim 23, wherein the semiconductor substrate and the semiconductor layer have the second conductivity type.

26. The solid state imaging device of claim 25, wherein an impurity concentration of the semiconductor substrate is higher than an impurity concentration of the semiconductor layer.

27. The solid state imaging device of claim 25, wherein the first isolation diffusion layer where the second and third insulating isolation regions are disposed is in contact with a surface of the semiconductor substrate.

28. The solid state imaging device of claim 18, wherein an impurity concentration of the plurality of photoelectric conversion elements is lower than the impurity concentration of the first isolation diffusion layer.

29. The solid state imaging device of claim 18, wherein each of the plurality of photoelectric conversion elements extends to a depth less than a depth of than the first isolation diffusion layer.

30. The solid state imaging device of claim 18 further comprising:
a second conductivity type semiconductor layer having an impurity concentration disposed below the plurality of photoelectric conversion elements, the impurity concentration of the second conductivity type semiconductor layer being lower than the first impurity concentration.

31. A solid state imaging device comprising:
a substrate;
a plurality of photoelectric conversion elements of a first conductivity type arranged in an array in the substrate, wherein the plurality of photoelectric conversion elements include a first photoelectric conversion element, a second photoelectric conversion element and a third photoelectric conversion element, the first photoelectric conversion element is disposed in row m and column n, where each of m and n is a positive integer, the second photoelectric conversion element is disposed in the row m and column n+1, the third photoelectric conversion element is disposed in row m+1 and the column n+1;

a plurality of amplifier transistors disposed in the substrate;
an insulating isolation part disposed in the substrate, wherein the insulating isolation part includes a first insulating isolation region, a second insulating isolation region and a third insulating isolation region, wherein the first insulating isolation region is disposed between the second and third photoelectric conversion elements, wherein the second and third insulating isolation regions are disposed between the first photoelectric conversion element and the second photoelectric conversion element, and wherein one of the plurality of the transistors is disposed between the second and third insulating isolation regions;
a first isolation diffusion layer of a second conductivity type disposed in the substrate, wherein the first isolation diffusion layer is disposed below the first to third insulating isolation regions;
a second isolation diffusion layer of the second conductivity type disposed in the substrate and disposed between the first and second photoelectric conversion elements, wherein the second isolation diffusion layer is disposed above the first isolation diffusion layer, wherein the second insulating isolation region, the third insulating isolation region and the one of the plurality of amplifier transistors are disposed in the same second isolation diffusion layer, and wherein the second isolation diffusion layer has a higher impurity concentration than the first isolation diffusion layer.

* * * * *